United States Patent [19]
Roche

[11] 3,967,191
[45] June 29, 1976

[54] METHOD AND APPARATUS FOR NON-DESTRUCTIVELY MEASURING INTERNAL FILM RESISTANCE IN A FLUORESCENT LAMP

[75] Inventor: William J. Roche, Merrimac, Mass.

[73] Assignee: GTE Sylvania Incorporated, Danvers, Mass.

[22] Filed: Feb. 28, 1975

[21] Appl. No.: 554,035

[52] U.S. Cl. .......................... 324/20 R; 324/30 A; 324/62; 324/65 R
[51] Int. Cl.² ........................................ G01R 31/24
[58] Field of Search ............ 324/62, 65 R, 20, 30 A, 324/54

[56] References Cited
UNITED STATES PATENTS

| | | | |
|---|---|---|---|
| 2,793,343 | 5/1957 | Wagner | 324/62 R |
| 3,296,523 | 1/1967 | Haas | 324/65 R |
| 3,566,695 | 3/1971 | Guderjahn | 324/30 A |
| 3,612,993 | 10/1971 | Tims | 324/62 R |

FOREIGN PATENTS OR APPLICATIONS

| | | | |
|---|---|---|---|
| 894,264 | 4/1962 | United Kingdom | 324/30 A |

Primary Examiner—R. V. Rolinec
Assistant Examiner—Michael J. Tokar
Attorney, Agent, or Firm—Edward J. Coleman

[57] ABSTRACT

The resistance of a conductive film coating on the interior bulb wall of a fluorescent lamp is measured by capacitive coupling from the exterior bulb wall. A pair of metal bands engage the exterior bulb wall, with one band being connected to ground through a sensing resistor and the other band being connected through a series inductance to a variable frequency signal generator. The sinusoidal voltage output of the generator is set to a fixed frequency equal to or less than 15 KHz, and the series inductance is selected to provide a resonant circuit during lamp testing. The voltage across the sensing resistor is measured and compared with a predetermined reference voltage or a measurement of the generator output voltage to provide an indication of the internal film resistance of the tested lamp.

29 Claims, 4 Drawing Figures

3,967,191

METHOD AND APPARATUS FOR NON-DESTRUCTIVELY MEASURING INTERNAL FILM RESISTANCE IN A FLUORESCENT LAMP

BACKGROUND OF THE INVENTION

This invention relates to the manufacture of fluorescent lamps and, more particularly to a method and apparatus for non-destructively measuring the internal film resistance in a fluorescent lamp.

A conductive film coating on the interior bulb wall of a fluorescent lamp provides for easier lamp starting than would be possible in a conventional fluorescent lamp. The resistance of the film must be of a specific value, however, in order for this beneficial starting effect to occur. For this reason, a means of measuring such a film without destroying the lamp is needed during production of the lamp. The conductive films referred to can be either $SnO_2$ or $In_2O_3$, these being the most commonly used, or any other film which is compatible with fluorescent lamp making. These films are applied to the inner wall of the bulb before the phosphor coating is applied. The bulbs are then processed into finished fluorescent lamps in a conventional manner.

In particular, these films are beneficial in starting energy saving fluorescent lamps. Such lamps use krypton gas as a constituent of the filling gas. Krypton gas is a more efficient gas than the argon gas customarily used in fluorescent lamps and it is for this reason that it is being used in energy saving lamps. An undesirable property of krypton gas, however, is the hard starting property which it imparts to a fluorescent lamp. With a conductive film of the proper resistance value, however, this objectionable property can be eliminated.

Prior to the development of the present invention, the internal film resistance of the lamp measured destructively by opening the lamp and attached probes to the bulb wall after the phosphor was removed. Such a procedure is obviously time consuming and does not permit a 100% inspection of the finished product. Further, the accuracy of the measurement as it relates to the evacuated lamp is in doubt. More specifically, with some conductive films, the presence of $O_2$ at atmospheric pressure produces changes in the film resistance. Consequently, the film resistance measured using a destructive method will not necessarily be that of the original lamp.

SUMMARY OF THE INVENTION

In view of the foregoing, it is an object of this invention to provide improved means for measuring the internal film resistance of fluorescent lamps.

Briefly, a non-destructive method for measuring the internal film resistance is provided by capacitive coupling from the exterior bulb wall of the fluorescent lamp under test. A pair of spaced apart coupling means, such as metal bands, are disposed on the exterior bulb wall, with each band at least partially encircling the bulb. One of the metal bands is connected through a sensing resistor to a source of reference potential, while the other metal band is connected through a series inductance to a variable frequency AC voltage supply. Preferably, a frequency equal to or less than 15 KHz is employed, and the series inductance is selected to provide a resonant circuit. Means is provided for measuring at least the voltage, $V_s$, across the sensing resistance means. The internal film resistance, $R_{ic}$, is determined by the equation $$R_{ic} = R_s (V_g \cos \theta - V_s)/V_s$$

where $R_s$ is the value of the sensing resistance, $V_g$ is the output voltage of said AC supply, and the angle $\theta$ is the phase relationship between the voltage waveforms $V_g$ and $V_s$.

BRIEF DESCRIPTION OF THE DRAWINGS

This invention will be more fully described hereinafter in conjunction with the accompanying drawings, in which.

DESCRIPTION OF PREFERRED EMBODIMENT

Figure 1:
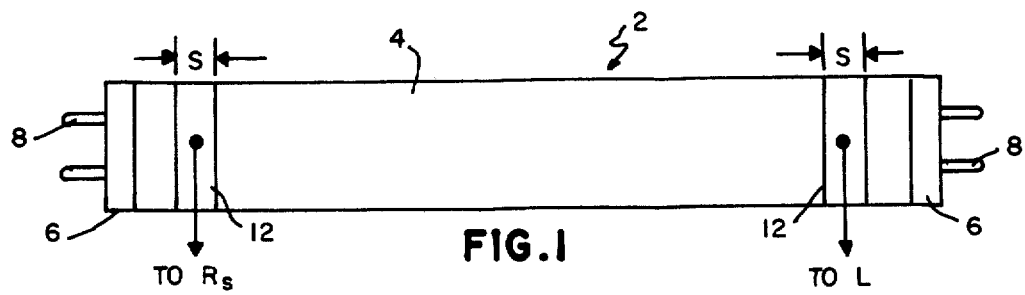
FIG. 1 is a diagrammatic elevation of a fluorescent lamp having metal band contacts located at opposite ends of the lamp bulb in accordance with the invention.
Figure 2:
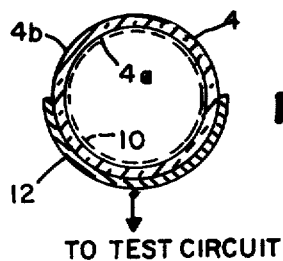
FIG. 2 is a diagrammatic sectional view of the lamp of FIG. 1 as received and engaged by a semicircular band contact.

Referring to FIGS. 1 and 2, the typical fluorescent lamp 2 to be tested in accordance with the invention has an elongated tubular glass envelope, or bulb, 4. Lamp bases 6 are attached to each end of the lamp bulb, with terminal pins 8 projecting therefrom. The interior bulb wall 4a of the lamp has a conductive film coating 10, such as $SnO_2$ or $In_2O_3$, for facilitating starting, with the typical phosphor coating being disposed over the conductive film.

The operation of the non-destructive film resistance measurement procedure can be best understood by analyzing the low frequency equivalent circuit presented by the lamp. This low frequency equivalent circuit is included in the test circuit of FIG. 3. The conductive film coating on the interior bulb wall can be represented by a resistance $R_{ic}$. Access to this internal film resistance is obtained by disposing a pair of spaced apart metal bands 12 around and in contact with a section of the external bulb wall 4b (FIGS. 1 and 2). These bands need not encircle the lamp completely and the band widths will depend on factors to be described later. The exterior metal bands each form a capacitive coupling, $2C_{ic}$, to the interior bulb wall. One plate of this capacitor is the exterior metal band 12 while the other plate is the segment of the internal conductive film 10 covered by the metal band (FIG. 2). The bulb wall 4 between the plates functions as the capacitor dielectric. Typically the metal bands 12 are located at opposite ends of the fluorescent lamp bulb, as illustrated in FIG. 1, although the bands may be spaced closed together for providing profile measurements.

In the test circuit shown in FIG. 2, one of the capacitive coupling means ($2C_{ic}$), i.e. a metal band contact 12, is connected through a sensing resistor $R_s$ to a source of reference potential, illustrated as ground. The other coupling means ($2C_{ic}$), or band 12, is connected through a series inductance L to one terminal of a variable frequency AC voltage supply 12 having a voltage output of $V_g$. A second terminal of the AC supply is connected to ground. Preferably, AC supply 14 is a sinusoidal test signal generator with an output frequency selected to be fixed at about 15 KHz or less.

Both the generator output voltage, $V_g$, and the voltage across the sensing resistor, $V_s$, are monitored and displayed simultaneously on a dual channel oscilloscope 16. This allows both the magnitude of $V_g$ and $V_s$ as well as their phase relationship to be measured. From the steady state response of the circuit of FIG. 3, the internal film resistance $R_w$ can be determined from the following equation:

$$R_w = R_s (V_g \cos \theta - V_s)/V_s \quad (1)$$

The angle $\theta$ in equation (1) is the phase relationship between the voltage waveforms $V_g$ and $V_s$ measured on the oscilloscope. For a particular output frequency of the generator, the circuit of FIG. 3 will be in resonance, with the result that $\theta$ in equation (1) will be zero. Consequently, $\cos \theta$ in equation (1) will be unity. Equation (1) is then simplified to, $$R_w = R_s \frac{V_g - V_s}{V_s} \quad (2)$$

The frequency at which equation (2) is applicable can be determined analytically as, $$f_r = 1/(2\pi\sqrt{LC_w}) \quad (3)$$

where $C_w$ is the total series capacitance incurred at both ends of the lamp.

As mentioned previously, the upper portion of FIG. 3 represents the low frequency equivalent lamp circuit. Consequently, $f_r$ must be held below a specific value for the above analysis to be free from serious error. We have determined that an $f_r$ equal to 15 KHz is an acceptable upper limit on the generator test frequency. This puts a constraint on the inductive/capacitive product in the circuit. The capacitance $2C_w$ is a function of the glass thickness and the area of the metal band contact. This relationship is given by:

$$2C_w = \frac{K\epsilon_o \phi S}{\ln(b/a)} \quad (4)$$

Where:
$\epsilon_o$ is the free space permittivity;
$\phi$ is the circumferential section of bulb covered by the band, expressed in radians;
$S$ is the width of the band contact;
$b$ is the radius of the outer tubular wall 4b of the bulb;
$a$ is the radius of the inner tubular wall 4a of the bulb; and,
$K$ is the dielectric constant of the bulb material, viz. the glass.

The two variables which are functions of the metal band contacts 12 and $\phi$ and S. For ease in testing, especially in the production situation, a full 360° enclosure of the lamp by the metal band contact is undesirable and impractical. A smaller contact 12 angle of approximately 180°, such as illustrated in FIG. 2, would allow the lamp to be dropped into the semicircular contact member for measurement and then removed at a high speed, compatible with high speed lamp making equipment. Of course, the 180° contact may be formed by shorter segments, such as a pair of 90° band segments. The other controllable variable is the band contact width, S. This contact width should be large enough so that slight irregularities in the glass tube are averaged out and do not affect the measurement. It should not be so large as to extend over a significant section of the tube thus making an end-of-tube to end-of-tube measurement impossible. Also, significant contact error resistance will be introduced if the contact width is made too large. This occurs since the inner wall conductive film 10 which is covered by the external metal contact 12 is not an ideal capacitor plate, but does have a distributed resistance. I have found that a contact length of about 7 centimeters is a good compromise length.

Having selected the size of the band contacts 12 and the frequency, $f_r$, of the AC supply 14, the value of the series inductance L for providing a tuned resonant circuit may be computed from the equation $$L = \frac{1}{(2\pi f_r)^2 C_w} \quad (5)$$

which is obtained by appropriate transposition of equation (3). For example, using a value of $S = 7$ cm, $\phi = \pi$ radians, $\epsilon_o = 8.85 \times 10^{-14}$ f/cm, $K = 7.2$, $b = 1.9$ cm, and $a = 1.8$ cm, a value for $2 C_w$ can be computed, using equation (4), as $259 \times 10^{-12}$ farads. Substituting half of this value for $C_w$ in equation (5) and using a value of 15 KHz for $f_r$ yields the desired inductance, L. The value for L is 869 mh in this particular example.

Figure 3:
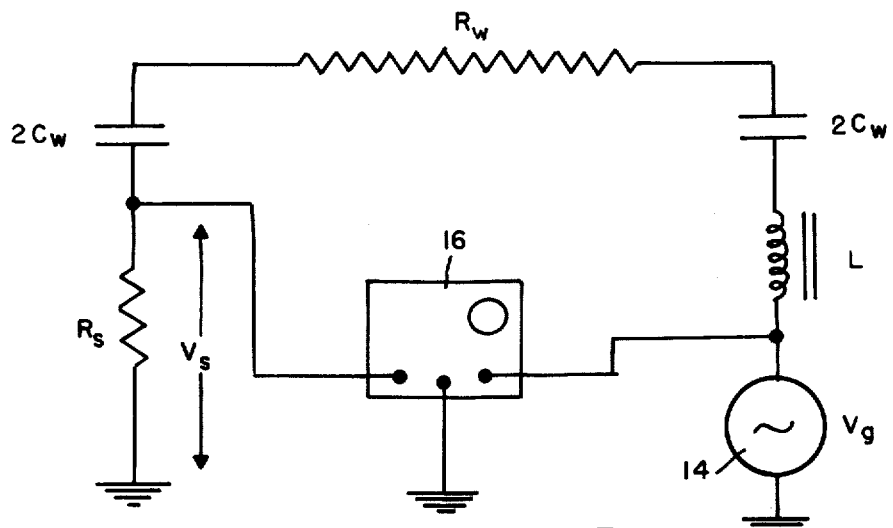
FIG. 3 is a diagram of a test circuit in accordance with the invention, with the lamp and band contacts of FIG. 1 being represented as elements of a low frequency equivalent circuit.

Having established an upper limit on frequency for maximum accuracy, and having determined the value of inductance required in the test circuit of FIG. 3, equation (2) can be used to determine the resistance, $R_w$, of the conductive film on the interior bulb wall between the exterior metal contacts. The value of $V_g$ and $V_s$ are determined directly from the oscilloscope. The value of $R_s$ is arbitrary — I have used a value of $10^4$ ohms.

Figure 4:
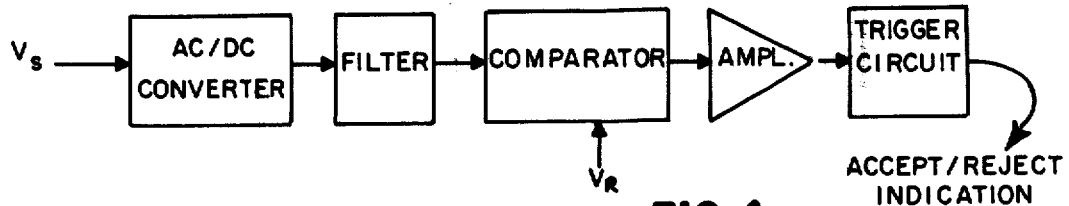
FIG. 4 is a block diagram of an alternative measuring means for the circuit of FIG. 3.

For the high speeds encountered in fluorescent lamp making, the oscilloscope can be replaced with automatic equipment designed to indirectly evaluate equation (2) for $R_w$, and to exercise an option of either automatically rejecting the lamp or allowing it to be passed. For example, FIG. 4 illustrates a circuit arrangement which may be used as an alternative measuring means in lieu of oscilloscope 16. In this instance, only the voltage $V_s$ across the sensing resistor $R_s$ is measured and compared with a reference voltage $V_r$. The reference $V_r$ is a norm or ideal $V_s$ which corresponds to a selected internal film resistance $R_w$ in accordance with the relationship (1) or (2). As shown in FIG. 4, the sinusoidal $V_s$ may be applied through an AC or DC converter and filter as a first input to a voltage comparator, $V_r$ being applied as the second input to the comparator. In response to these two input voltages, the comparator generates an error voltage representative of the difference between $V_s$ and $V_r$, with a tolerance determined by the designed pass band of the comparator. After amplification, this error voltage may then be applied to a trigger circuit to provide an accept/reject indication of whether or not the internal film resistance of the tested lamp is approximately equal to the selected $R_w$ corresponding to $V_r$.

Although the invention has been described with respect to specific embodiments, it will be appreciated that modifications and changes may be made by those skilled in the art without departing from the true spirit and scope of the invention. For example, the upper frequency limit of AC supply 14 could be increased to say, 100KHz, provided the error introduced by the transmission line effect of the lamp at these higher frequencies is accommodated for in selecting $V_r$. It will also be appreciated that the series inductance, L, may be connected between $R_s$ and the metal band coupling means ($2C_w$) on the left hand side of FIG. 3, in lieu of the indicated connection to AC supply 14.

What I claim is:

1. A method for non-destructively measuring the resistance, $R_w$, of a conductive film coating on the interior bulb wall of a fluorescent lamp, said method comprising:

disposing first and second spaced apart capacitive coupling means on the exterior bulb wall of said fluorescent lamp, said first capacitive coupling means being connected through a sensing resistance means to a source of reference potential, and said second capacitive coupling means being connected through circuit means to a first output terminal of a variable frequency AC voltage supply, a second terminal of said AC voltage supply being connected to said source of reference potential, said AC supply being at a selected fixed frequency, and the circuit including said first and second capacitive coupling means and said circuit means being in resonance at the selected frequency of said AC voltage supply;

and measuring at least the voltage, $V_s$, across said sensing resistance means, said internal film resistance $R_w$ being determinable from the equation $$R_w = R_s (V_g \cos\theta - V_s)/V_s$$

where $R_s$ is the value of said sensing resistance, $V_g$ is the output voltage of said AC supply, and the angle $\theta$ is the phase relationship between the voltage waveforms $V_g$ and $V_s$.

2. The method of claim 1 wherein the frequency of said AC voltage supply is selected to be about 15 KHz or less.

3. The method of claim 1 wherein each of said first and second capacitive coupling means comprises a metal band in contact with a section of said exterior bulb wall and at least partially encircling said bulb.

4. The method of claim 3 wherein said first and second metal bands are located at opposite ends of said fluorescent lamp bulb.

5. The method of claim 1 wherein both the voltage, $V_s$, across said resistance means and the voltage output, $V_g$, of said AC supply are measured and compared.

6. The method of claim 5 wherein both the magnitude and phase relationship $\theta$ of the voltages $V_g$ and $V_s$ are measured by means of a dual channel oscilloscope having one channel connected across said sensing resistance means and the other channel connected across the output of said AC supply.

7. The method of claim 1 wherein a reference voltage $V_r$ is determined which is equal to a $V_s$ corresponding to a selected $R_w$, and for each lamp tested, the measured voltage, $V_s$, across the sensing resistance is compared with said reference voltage $V_r$ to provide an accept/reject indication of whether or not the internal film resistance of the tested lamp is approximately equal to said selected $R_w$.

8. The method of claim 1 wherein the circuit means connected between said second capacitive coupling means and the first output terminal of said AC supply comprises a series inductance.

9. The method of claim 8 wherein the circuit including said first and second capacitive coupling means and said series inductance is in resonance at the selected frequency of said AC voltage supply, and said internal film resistance $R_w$ is determinable from the equation $$R_w = R_s \frac{V_g - V_s}{V_s}.$$

10. The method of claim 9 wherein said AC voltage supply is a sinusoidal test signal generator with the output frequency selected to be about 15 KHz or less.

11. The method of claim 10 wherein each of said first and second capacitive coupling means comprises a metal band in contact with a tubular section of said exterior bulb wall and at least partially encircling said tubular bulb, and said resonant circuit is provided by selecting the size of said band contacts and the frequency, $f_r$, of said AC supply, then determining the value of the series inductance, L, from the equation $$L = \frac{1}{(2\pi f_r)^2 C_w}$$

where $2C_w$ is the coupling capacitance provided by each of said metal band contacts with respect to the segment of internal conductive film covered by the metal band and separated therefrom by the wall thickness of said bulb, said coupling capacitance being given by the equation $$2C_w = \frac{K\epsilon_0 \phi S}{\ln(b/a)}$$

where $\epsilon_0$ is the free space permittivity; $\phi$ is the circumferential section of bulb covered by the metal band, expressed in radians; S is the width of the band contact; b is the radius of the outer tubular wall of the bulb; a is the radius of the inner tubular wall of the bulb; and K is the dielectric constant of the bulb material.

12. The method of claim 11 wherein $\phi$ is about $\pi$ radians and S is about 7 centimeters.

13. The method of claim 12 wherein said sensing resistance means is a resistor having a value of about $10^4$ ohms.

14. The method of claim 12 wherein said first and second metal bands are located at opposite ends of said fluorescent lamp bulb.

15. Apparatus for non-destructively measuring the resistance of a conductive film coating on the interior bulb wall of a fluorescent lamp, said apparatus comprising:

a pair of spaced apart metal contact members for receiving and engaging the exterior bulb wall of said fluorescent lamp;

a sensing resistor connected between one of said contact members and a source of reference potential;

a variable frequency AC voltage supply connected through circuit means to the other of said contact members, said supply being referenced to said source of reference potential;

and means for measuring the voltage across said sensing resistor.

16. Apparatus according to claim 15 wherein said last-mentioned means includes means for deriving from the measured sensing voltage an indication of whether or not the internal film resistance of the tested lamp is approximately equal to a predetermined value.

17. Apparatus according to claim 15 wherein said last-mentioned means is for measuring both the voltage across said sensing resistor and the voltage output of said AC supply.

18. Apparatus according to claim 17 wherein said measuring means comprises a dual channel oscilloscope having one channel connected across said sensing resistor and the other channel connected across the output of said AC supply.

19. Apparatus according to claim 17 wherein said measuring means includes means for deriving from the measured sensing and supply voltages an indication of the internal film resistance of the tested lamp.

20. Apparatus according to claim 15 wherein each of said contact members comprises a metal band adapted to at least partially encircle the exterior bulb wall of a fluorescent lamp engaged thereby.

21. Apparatus according to claim 15 wherein said circuit means connected between the AC voltage supply and a contact member comprises a series inductance.

22. Apparatus according to claim 21 wherein the frequency of said AC voltage supply is selected to be about 15 KHz or less.

23. Apparatus according to claim 22 wherein said AC supply is at a selected fixed frequency, and the value of said series inductance is selected to provide a resonant circuit at said selected frequency when a fluorescent lamp is engaged by said contact members.

24. Apparatus according to claim 23 wherein each of said contact members comprises a metal band adapted to at least partially encircle the exterior bulb wall of a fluorescent lamp engaged thereby.

25. Apparatus according to claim 24 wherein each of said metal bands has a width of about 7 centimeters and a substantially semicircular shape adapted to engage the tubular bulb wall of a lamp received thereby.

26. Apparatus according to claim 25 wherein said sensing resistor has a value of about $10^4$ ohms.

27. Apparatus according to claim 22 wherein said AC voltage supply is a sinusoidal test generator with the output frequency selected to be about 15 KHz or less.

28. Apparatus according to claim 15 further including a series inductance connected between said sensing resistor and said one of said contact members.

29. The method of claim 1 further including a series inductance connected between said sensing resistance means and said first capacitive coupling means.

* * * * *